United States Patent
Yang et al.

(10) Patent No.: US 8,225,166 B2
(45) Date of Patent: Jul. 17, 2012

(54) SIGNAL PROCESSING APPARATUS FOR SETTING ERROR INDICATION INFORMATION ACCORDING ERROR DETECTION RESULT OF OUTER-CODE DECODER OUTPUT AND RELATED METHOD THEREOF

(75) Inventors: Shun-An Yang, Hsinchu County (TW); Che-Li Lin, Hsin-Chu Hsien (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 830 days.

(21) Appl. No.: 12/368,182

(22) Filed: Feb. 9, 2009

(65) Prior Publication Data

US 2010/0205515 A1 Aug. 12, 2010

(51) Int. Cl.
*H03M 13/00* (2006.01)
(52) U.S. Cl. ......... 714/752; 714/758; 714/782; 714/784
(58) Field of Classification Search .................. 714/752, 714/758, 782, 784
See application file for complete search history.

(56) References Cited

U.S. PATENT DOCUMENTS

| | | | | |
|---|---|---|---|---|
| 7,424,662 | B2* | 9/2008 | Eroz et al. | 714/758 |
| 8,065,598 | B1* | 11/2011 | Gunnam et al. | 714/800 |
| 2002/0133779 | A1* | 9/2002 | Shieh | 714/755 |
| 2008/0155372 | A1* | 6/2008 | Kravitz et al. | 714/752 |
| 2009/0271688 | A1* | 10/2009 | Jiang et al. | 714/784 |
| 2010/0211857 | A1* | 8/2010 | Kobayashi | 714/784 |

* cited by examiner

*Primary Examiner* — Sam Rizk
(74) *Attorney, Agent, or Firm* — Winston Hsu; Scott Margo

(57) ABSTRACT

A signal processing apparatus is provided. The signal processing apparatus includes an inner-code decoder, an outer-code decoder, and an error detection unit. The inner-code decoder decodes an input data stream to generate a first output data stream, wherein the input data stream is coded using a concatenated coding scheme including an outer coding and an inner coding. The outer-code decoder decodes the first output data stream to generate a second output data stream. The error detection unit performs an error detection upon the second output data stream to generate an error detection result. The decision logic sets error indication information of the second output data stream according to at least the error detection result.

19 Claims, 5 Drawing Sheets

SIGNAL PROCESSING APPARATUS FOR SETTING ERROR INDICATION INFORMATION ACCORDING ERROR DETECTION RESULT OF OUTER-CODE DECODER OUTPUT AND RELATED METHOD THEREOF

BACKGROUND

The present invention relates to identifying errors in a data stream, and more particularly, to a signal processing apparatus for setting error indication information according to an error detection result generated from performing an error detection (e.g., a parity check) upon an output of an outer-code decoder (e.g., a BCH decoder) and related method thereof.

In contrast to the analog television system using analog signals to carry audio and video information, a digital television (DTV) system sends and receives audio and video information by means of digital signals. However, for a DTV receiver, it is still possible that some noise or impairments occur in the signal transmission over the air. Therefore, the received transport stream might contain error packets. Please refer to FIG. 1, which is a diagram of a conventional DTV receiver. The DTV receiver 100 includes an antenna 102, a tuner 104, a demodulator 106, a backend processor 108, and a memory 110. The antenna 102 receives a digital television signal S_DTV, and then the tuner 104 performs down-conversion and channel selection upon the received digital television signal S_DTV. Next, the demodulator 106 demodulates an output of the tuner 104 to generate a transport stream D_TS to the following backend processor 108. The memory 110 is allocated to the backend processor 108 for buffering data generated and requested by the backend processor 108. The backend processor 108 decodes the transport stream D_TS using a proper decoding scheme (e.g., an MPEG decoding or AVS decoding) to generate an audio/video output S_A/V to an output device 150 such that contents of a television channel selected by the user are played via the output device 150 (e.g., a display device).

As shown in FIG. 1, the audio/video output S_A/V is derived from decoding the transport stream D_TS. When the transport stream D_TS contains error packets, the backend processor 108 would fail to generate correct audio/video output S_A/V. If an error packet indication could be provided to the backend processor 108, it can help the backend processor 108, such as an MPEG processor or AVS processor, to correctly deal with the received transport stream D_TS including error packets. In general, a concatenated coding scheme, including an outer coding and an inner coding, is employed to encode a data stream before the data stream is broadcasted over the air. For example, the outer coding and the inner coding are implemented using a Low Density Parity Check (LDPC) coding and a Bose-Chaudhuri-Hocquenghem (BCH) coding, respectively. As a result, the data stream is first encoded using the BCH coding, and then encoded using the LDPC coding. Therefore, the demodulator in the DTV receiver requires an LDPC decoder and a BCH decoder to correctly decode the received data stream coded using the concatenated coding scheme including the LDPC coding (i.e., the inner coding) and the BCH coding (i.e., the outer coding).

Provided the DTV receiver 100 is a conventional DVB-S2 (digital video broadcast-satellite version 2) receiver, the demodulator 106 therefore has a BCH decoder (not shown) and an LDPC decoder (not shown) included therein. The BCH decoder is defined to have good error detection and correction capability according to the DVB-S2 standard. For example, the BCH decoder can correct up to eight error bits per BCH codeword. The decode status of the BCH decoder in the demodulator 106 therefore provides a reliable error indication for each BCH codeword processed by the BCH decoder. As shown in FIG. 1, the demodulator 106 therefore generates an error indication signal S_EI to the backend processor 108 according to the decode status of the BCH decoder with good error detection and correction capability. As the error indication signal S_EI indicates whether a packet is correct or not, the backend processor 108 therefore knows which packet in the transport stream D_TS is an error packet, and can properly deal with the transport stream D_TS generated from the demodulator 106 to optimize quality of the audio/video output S_A/V.

However, in contrast to the DVB-S2 standard, the digital terrestrial multimedia broadcast (DTMB) standard does not use a BCH decoder having good error detection and correction capability. For example, the BCH decoder in a DTV receiver complying with the DTMB standard can correct one error bit per BCH codeword (752 bits) only. Therefore, the BCH decoder has poor capability to know whether the decoded data is correct or not. For example, when the BCH decoder judges that no errors are presented in a codeword, it is not guaranteed that the codeword is error-free as the BCH decoder has poor error detection and correction capability. Similarly, it is not guaranteed that a one-bit correction made to the BCH codeword by the BCH decoder is able to make the corrected codeword become error-free. If the decode status of the BCH decoder is directly used to serve as the error indication signal, the error indication signal is quite unreliable.

Therefore, how to derive a reliable error indication signal for packets to improve the performance of the backend processor becomes an important issue for designers of DTV receivers complying with the DTMB standard.

SUMMARY

It is therefore one of the objectives of the present invention to provide a signal processing apparatus for setting error indication information according to an error detection result generated from performing an error detection (e.g., a parity check) upon an output of an outer-code decoder (e.g., a BCH decoder) and related method thereof.

According to one aspect of the present invention, a signal processing apparatus is provided. The signal processing apparatus includes an inner-code decoder, an outer-code decoder, an error detection unit, and a decision logic. The inner-code decoder is for decoding an input data stream to generate a first output data stream, wherein the input data stream is coded using a concatenated coding scheme including an outer coding and an inner coding. The outer-code decoder is coupled to the inner-code decoder, and used for decoding the first output data stream to generate a second output data stream. The error detection unit is coupled to the outer-code decoder, and used for performing an error detection upon the second output data stream to generate an error detection result. The decision logic is coupled to the error detection unit, and used for setting error indication information of the second output data stream according to at least the error detection result.

According to another aspect of the present invention, a signal processing method is provided. The signal processing method includes: performing an inner-code decoding upon an input data stream, coded using a concatenated coding scheme including an outer coding and an inner coding, to generate a first output data stream; performing an outer-code decoding upon the first output data stream to generate a second output data stream; performing an error detection upon the second output data stream to generate an error detection result; and setting error indication information of the second output data stream according to at least the error detection result.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

The present invention provides a signal processing apparatus for setting error indication information according to an error detection result generated from performing an error detection (e.g., a parity check of the inner code) upon an output of an outer-code decoder (e.g., a BCH decoder) and related method thereof. In one exemplary embodiment, the signal processing apparatus is implemented in a demodulator of a DTV receiver complying with the DTMB standard, and the parity check of the BCH decoder output is performed using the parity check logic including in the inner-code decoder (e.g., an LDPC decoder). More specifically, as the parity check unit is implemented to provide the error information required for modifying transport stream error indication (TEI) bits of a packet or generating an error indication signal, both of the LDPC decoder and the BCH decoder are used for correcting error bits found in the input data stream to achieve optimal error correction performance. Further details of the present invention are given as below.

Figure 1:
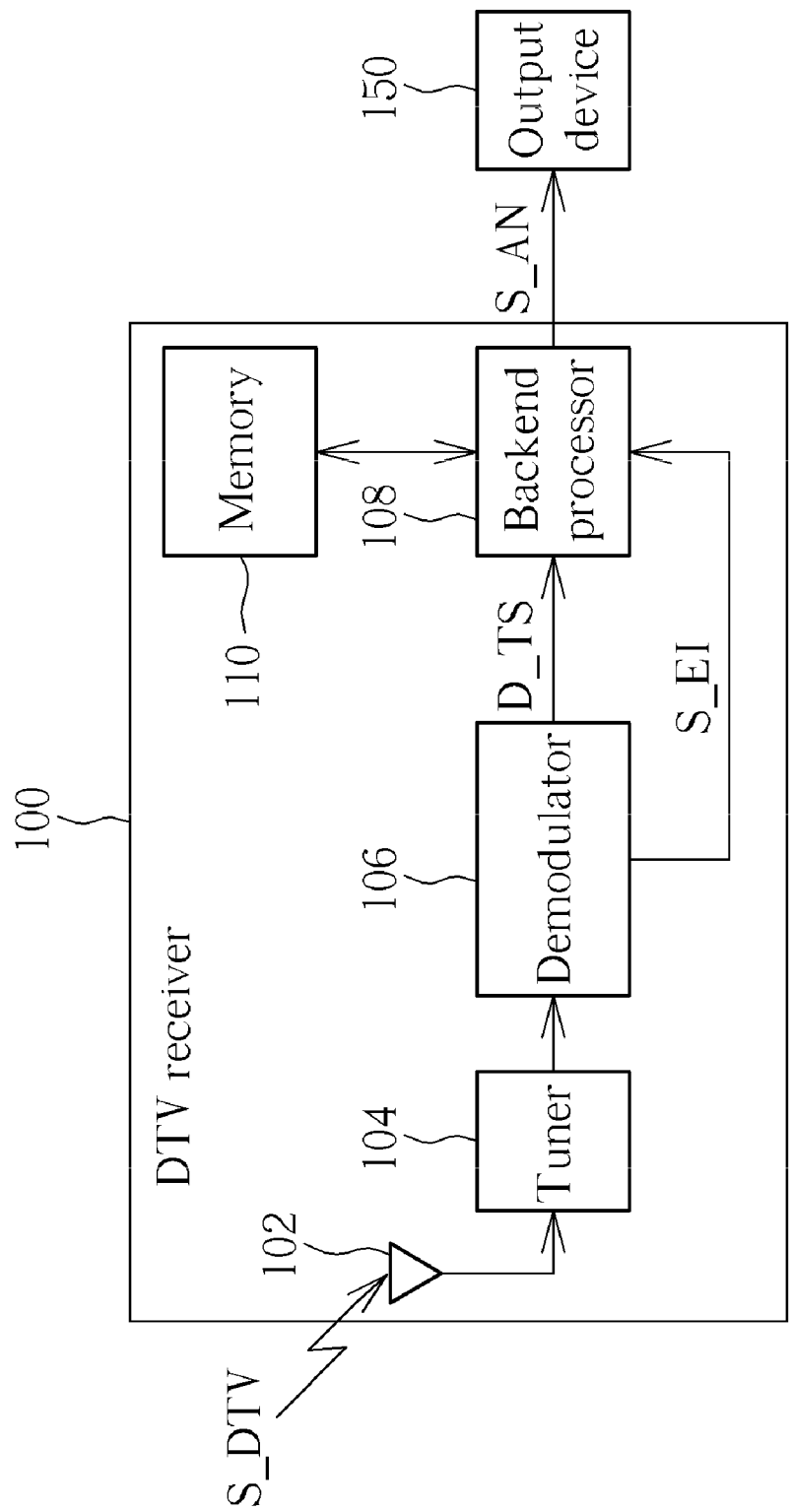
FIG. 1 is a diagram of a conventional DTV receiver
Figure 2:
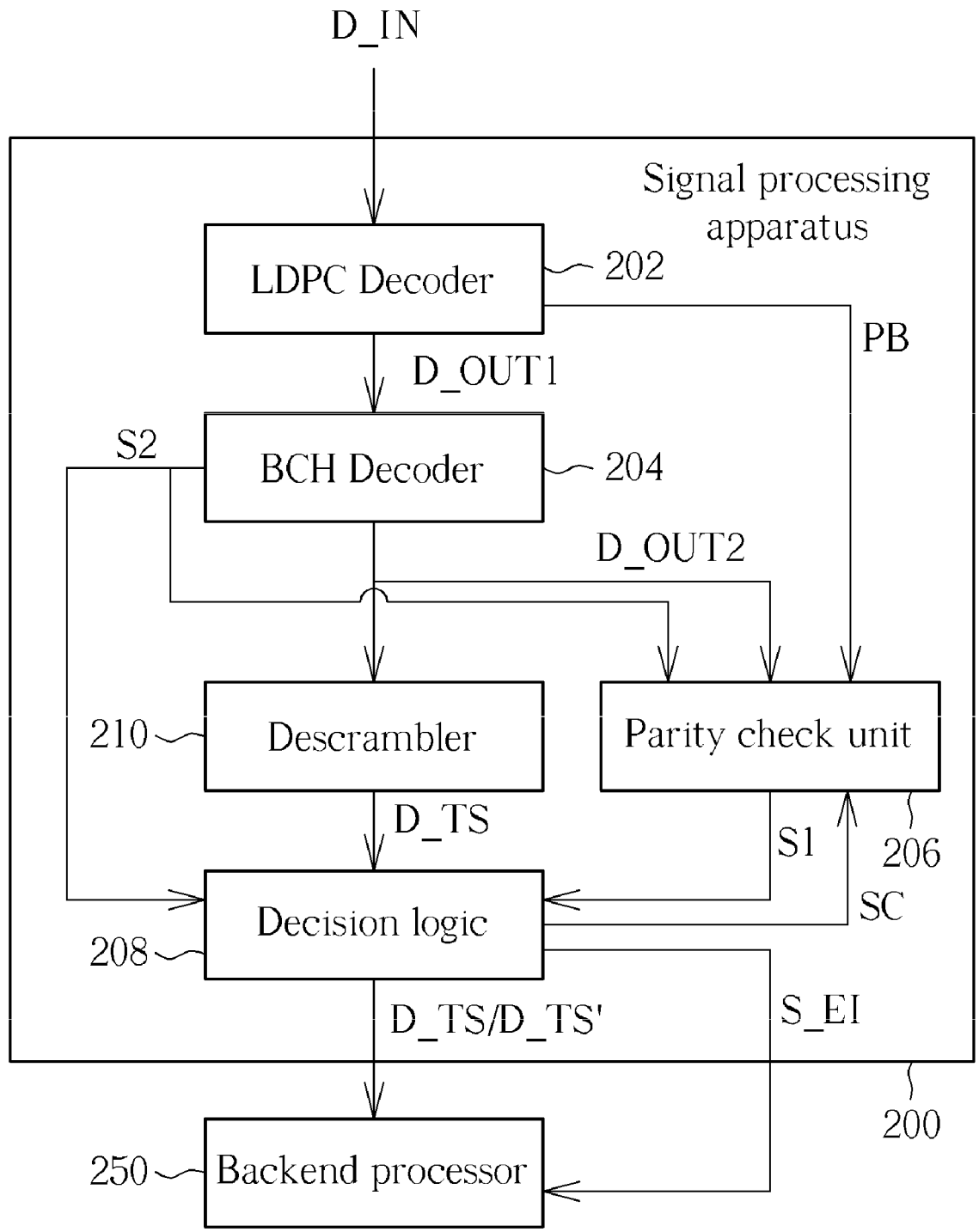
FIG. 2 is a block diagram illustrating a signal processing apparatus according to one exemplary embodiment of the present invention.

FIG. 2 is a block diagram illustrating a signal processing apparatus according to one exemplary embodiment of the present invention. The signal processing apparatus 200 includes, but is not limited to, an inner-code decoder (e.g., an LDPC decoder 202), an outer-code decoder (e.g., a BCH decoder 204), an error detection unit (e.g., a parity check unit 206), a decision logic 208, and a descrambler 210. In one application of the present invention, the signal processing apparatus 200 is implemented in a DTV receiver complying with the DTMB standard. For example, the signal processing apparatus 200 shown in FIG. 1 is integrated in a demodulator of the DTV receiver as a part of the demodulator. It should be noted that the LDPC decoder 202, the BCH decoder 204, and the descrambler 210 are common components used in the demodulator. However, this is for illustrative purposes only, and is not meant to be a limitation of the present invention. Any alternative design without departing from the spirit of the present invention falls within the scope of the present invention. For instance, as the signal processing apparatus 200 in this exemplary embodiment is applied to a DTV receiver complying with the DTMB standard, the required inner-code decoder is implemented using the LDPC decoder 202, the required outer-code decoder is implemented using the BCH decoder 204, and the required error detection unit is implemented using the parity check unit 206 which is an LDPC parity check unit due to the fact that the inner-code decoder is implemented using the LDPC decoder 202. In addition, as the parity check unit 206, external to the LDPC decoder 202, is configured to perform LDPC parity check, parity bits PB derived by the LDPC decoder 202 are therefore transmitted to the parity check unit 206. However, the present invention is not limited to such an application mentioned above. The signal processing apparatus of the present invention can be applied to any application required to process data streams coded using a concatenated coding scheme including an outer coding and an inner coding, and the actual implementation of the inner-code decoder, the outer-code decoder, and the error detection unit depends on the concatenated coding scheme. For instance, the kind of the parity check employed in the parity check unit 206 depends on the inner-code actually utilized. The operation and function of the signal processing apparatus 200 are detailed as follows.

The LDPC decoder 202 receives an input data stream D_IN from a preceding stage (e.g., a deinterleaver), and decodes the input data stream D_IN which is coded using a concatenated coding scheme including an outer coding (i.e., an LDPC coding in this embodiment) and an inner coding (i.e., a BCH coding in this embodiment) to generate a first output data stream D_OUT1 to the following outer-code decoder. The BCH decoder 204 decodes the first output data stream D_OUT1 to generate a second output data stream D_OUT2. In addition, the BCH decoder 204 further generates decode status information S2 associated with decoding of the first output data stream D_OUT1 to the decision logic 208. Please note that the BCH decoder 204 defined by the DTMB standard is only capable of correcting one bit per BCH code that has 752 bits. Therefore, the decode status information S2 has three possible statuses: the first status is to indicate that no error bit is found in the current BCH codeword (no correction required), the second status is to indicate that one error bit is found in the current BCH codeword (one bit is corrected), and the third status is to indicate that the current BCH codeword contains uncorrectable error bits due to more than one error bit found in the current BCH codeword.

As the hardware configuration shown in FIG. 2 is implemented in a DTV receiver complying with the DTMB standard, a descrambler 210 is therefore used to descramble the second output data stream D_OUT2 generated from the BCH decoder 204 to derive a transport stream D_TS including a plurality of packets. The parity check unit 206 performs an error detection (i.e., a parity check) upon data included in the second output data stream D_OUT2 to generate an error detection result S1 to the decision logic 208. The decision logic 208 is implemented to set error indication information.

With regard to a first error identification approach employed in the decision logic 208, the decision logic 208 sets error indication information (e.g., modifies TEI bits of a packet or generates an error indication signal) through monitoring the error detection result S1 only. For example, the decision logic 208 uses the result of parity check applied to the BCH decoder output to determine the correctness of each packet included in the transport stream D_TS. When the error detection result S1 shows that a specific packet fails to pass the parity check, the decision logic 208 determines that the specific packet is an error packet, and then sets the error indication information by modifying the TEI bits include in the specific packet. Therefore, a transport stream D_TS', including the specific packet with modified TEI bits, is delivered to following backend processor 250 for further processing. In this way, the backend processor 250 can properly deal with error Packets with the help of the error indication information provided by TEI bits set in each error Packet.

Regarding an alternative design of setting the error indication information, the decision logic 200 generates an error indication signal S_EI to the backend processor 250. When the error detection result S1 shows that a specific packet fails to pass the parity check, the decision logic 208 determines that the specific packet is an error packet, and then sets the error indication signal S_EI to inform the backend processor 250 of such an error packet. In addition, as no modification is made to the TEI bits included in the error packet in this alternative design, the decision logic 208 bypasses the transport stream D_TS generated from the descrambler 210 to the backend processor 250 for further processing. Alternatively, in this case, the descrambler 210 may forward the transport stream D_TS to the backend processor 250 directly without passing through the decision logic 208. In this way, the backend processor 250 can properly deal with error packets with the help of the error indication signal S_EI generated from the decision logic 208.

As mentioned above, a packet of the transport stream D_TS is treated as an error packet when decoded bits from the BCH decoder 204 that correspond to the packet fail to pass the parity check. However, parity checks may sometimes fail even when the decoded bits from the BCH decoder 204 are correct. This occurs when all the data bits are correct but some of the parity check bits (redundant bits) are incorrect. Therefore, a more flexible implementation is to allow certain parity check errors of the decoded bits generated from the BCH decoder 204 to exist when determining if a packet is correct or not. In such an implementation, the decision logic 208 is therefore configured to compare the number of failed parity checks with a threshold value to generate a comparison result, and then determines whether a packet is an error packet according to the comparison result. For example, the packet is treated as an error packet when the number of failed parity checks exceeds the threshold value.

Furthermore, by adjusting the threshold of allowed parity check errors, the optimal performance can be obtained. For example, the threshold value used by the decision logic 208 depends upon how the error packets are handled in the backend processor 250. Therefore, the backend processor 250 can adjust the threshold value set to the decision logic 208 according to the way it handles the error packets. In addition, the threshold value may depend on the code rate of the LDPC coding. For example, fewer parity bits (redundant bits) are included in the LDPC codeword when the LDPC coding uses higher code rate, and more parity bits are included in the LDPC codeword when the LDPC coding uses lower code rate. In a case where the LDPC coding uses lower code rate, the above-mentioned threshold value (i.e., the number of allowed parity check errors) could be set to a higher value. In another case where the LDPC coding uses higher code rate, the above-mentioned threshold value therefore is set to a lower value.

Figure 3:
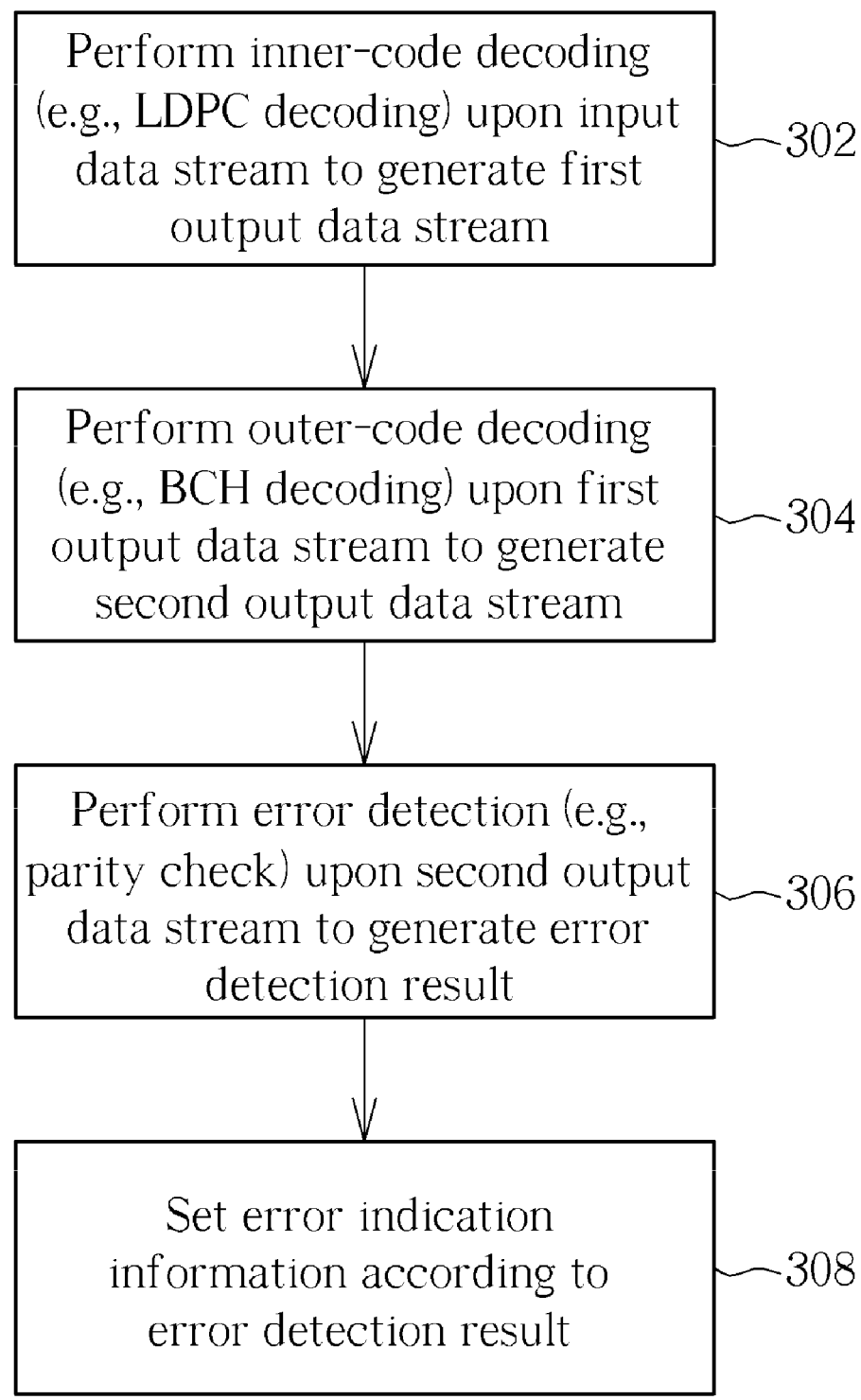
FIG. 3 is a flowchart illustrating one exemplary method of setting error indication information according to the present invention.

FIG. 3 is a flowchart illustrating one exemplary method of setting error indication information according to the present invention. The above disclosure directed to setting the error indication information through the first error identification approach can be briefly summarized using steps shown in FIG. 3. If the result is substantially the same, the steps are not required to be executed in the exact order shown in FIG. 3. The flow includes following steps:

Step 302: Perform an inner-code decoding (e.g., a LDPC decoding) upon an input data stream to generate a first output data stream.

Step 304: Perform an outer-code decoding (e.g., a BCH decoding) upon the first output data stream to generate a second output data stream.

Step 306: Perform an error detection (e.g., a parity check) upon the second output data stream to generate an error detection result.

Step 308: Set error indication information according to the error detection result.

As a person skilled in the art would readily understand operation of each step shown in FIG. 3 after reading above paragraphs, further description is omitted here for brevity.

The above discloses that the decision logic 208 only uses the error detection result S1 to modify the TEI bits or generate the error indication signal S_EI. However, in an alternative design, a second error identification approach can be adopted instead. In a case where the second error identification approach is employed in the decision logic 208, the decision logic 208 is configured to set error indication information (e.g., modify TEI bits or generate the error indication signal S_EI) through monitoring the error detection result S1 in conjunction with the decode status information S2. As mentioned above, the decode status information S2 has three possible statuses. When the decode status information S2 indicates that a specific BCH codeword contains uncorrectable error bits (i.e., the third status mentioned above), the parity check unit 206 stops performing the error detection upon data including the specific BCH codeword outputted from the BCH decoder 204, and the decision logic 208*b* directly sets the error indication information (e.g., modify TEI bits or generate the error indication signal S_EI) according to the decode status information S2. In one exemplary implementation, the decode status information S2 is also fed into the parity check unit 206 to directly serve as an indicator for informing the parity check unit 206 of the decode status of each BCH codeword, and the parity check unit 206 stops performing the error detection upon data including a specific BCH codeword outputted from the BCH decoder 204 when receiving the decode status information S2 which indicates that the specific BCH codeword contains uncorrectable error bits; in another exemplary implementation, the decision logic 208 is further configured to output a control signal SC to stop the parity check unit 206 from performing the error detection upon data including a specific BCH codeword outputted from the BCH decoder 204 when receiving the decode status information S2 which indicates that the specific BCH codeword contains uncorrectable error bits. Please note that these exemplary implementations are for illustrative purposes only. Other implementations capable of achieving the same objective of stopping the parity check unit 206 from performing the error detection upon data including a specific BCH codeword outputted from the BCH decoder 204 when the decode status information S2 indicates that the specific BCH codeword contains uncorrectable error bits still obey the spirit of the present invention. When a BCH codeword contains more than one error bit, the BCH decoder 204 fails to correct all of the error bits included in the BCH codeword due to poor correction capability. In this case, the decode status which indicates that the BCH codeword contains uncorrectable error bits is reliable because the BCH codeword generated from the BCH decoder 204 really has error bits remained therein. Therefore, as the decode status information S2 at this moment provides reliable error information to the decision logic 208, the parity check unit 206 is not required to perform parity check on data including the decoded output having uncorrected error bits. The power consumption could be reduced accordingly.

When the decode status information S2 corresponds to either of the remaining decode statuses, including the first status and the second status mentioned above, the parity check unit 206 works normally to perform parity check upon the BCH decoder output, and the decision logic 208 sets the error indication information according to the error detection result S1 as neither the first status nor the second status can provide reliable error information.

Figure 4:
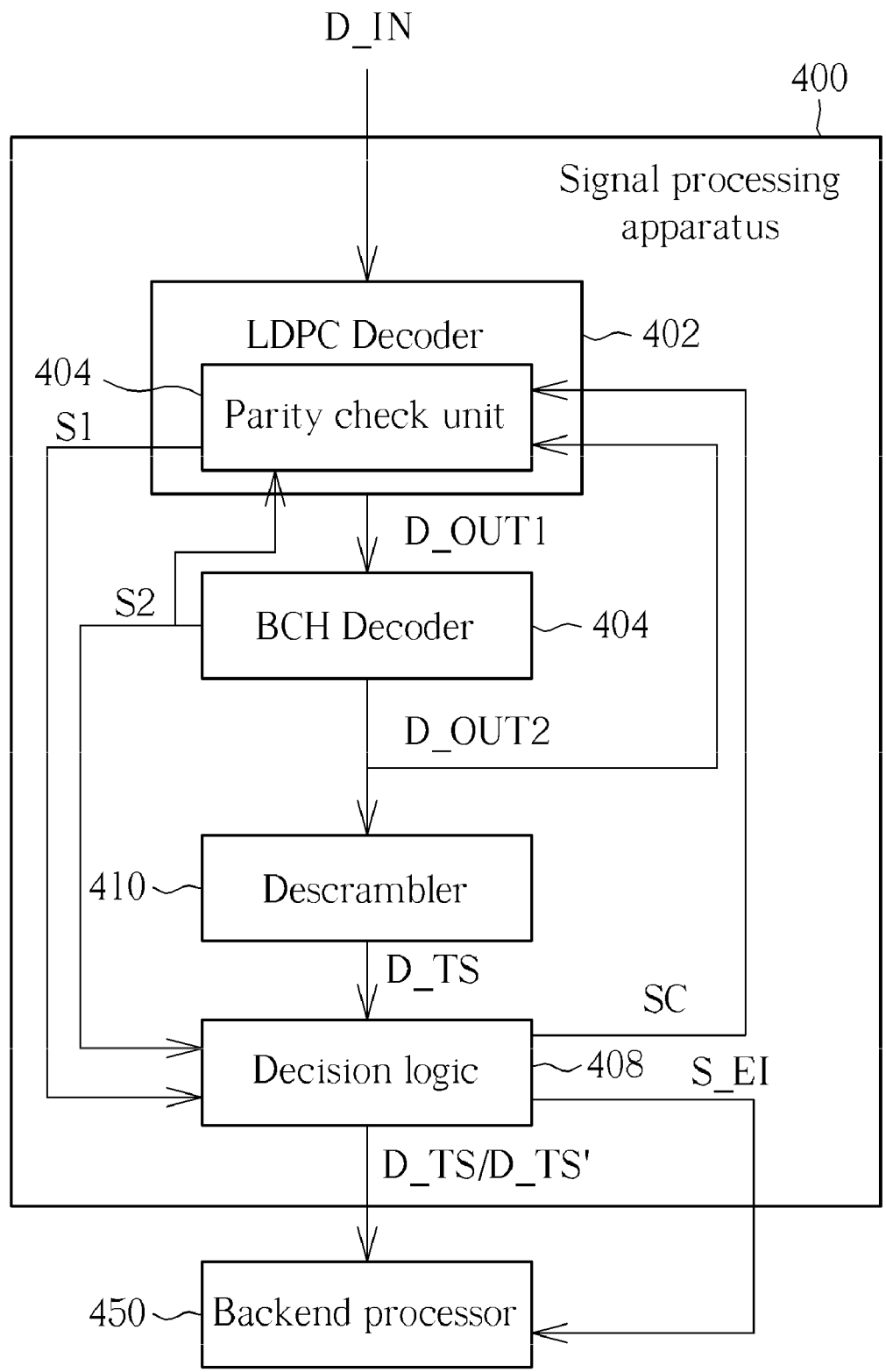
FIG. 4 is a block diagram illustrating a signal processing apparatus according to another exemplary embodiment of the present invention.

In the exemplary embodiment shown in FIG. 2, the parity check unit 206 is a standalone component external to the LDPC decoder 202. However, this is for illustrative purposes only. Generally speaking, the LDPC decoder 202 has internal parity check logic to complete the LDPC decoding operation. Therefore, in an alternative design, the parity check unit and the LDPC decoder can share one parity check logic in a time-sharing manner, thereby reducing the hardware cost. FIG. 4 shows a signal processing apparatus according to another exemplary embodiment of the present invention. The signal processing apparatus 400 in FIG. 4 is similar to the signal processing apparatus 200 in FIG. 2, except the LDPC decoder and the parity check unit. As shown in FIG. 4, the signal processing apparatus 400 includes an LDPC decoder 402 having a parity check unit 404 included therein. In other words, the parity check unit 404 is part of the LDPC decoder 402. In addition to performing parity check needed by the LDPC decoding operation, the parity check unit 304 is involved in performing parity check upon the BCH decoder output (i.e., the second output data stream D_OUT2) to derive the error detection result S1. As a person skilled in the art can readily understand function and operation of the signal processing apparatus 400 in FIG. 4 after reading above disclosure directed to the signal processing apparatus 200 in FIG. 2, further description is omitted here for brevity.

Figure 5:
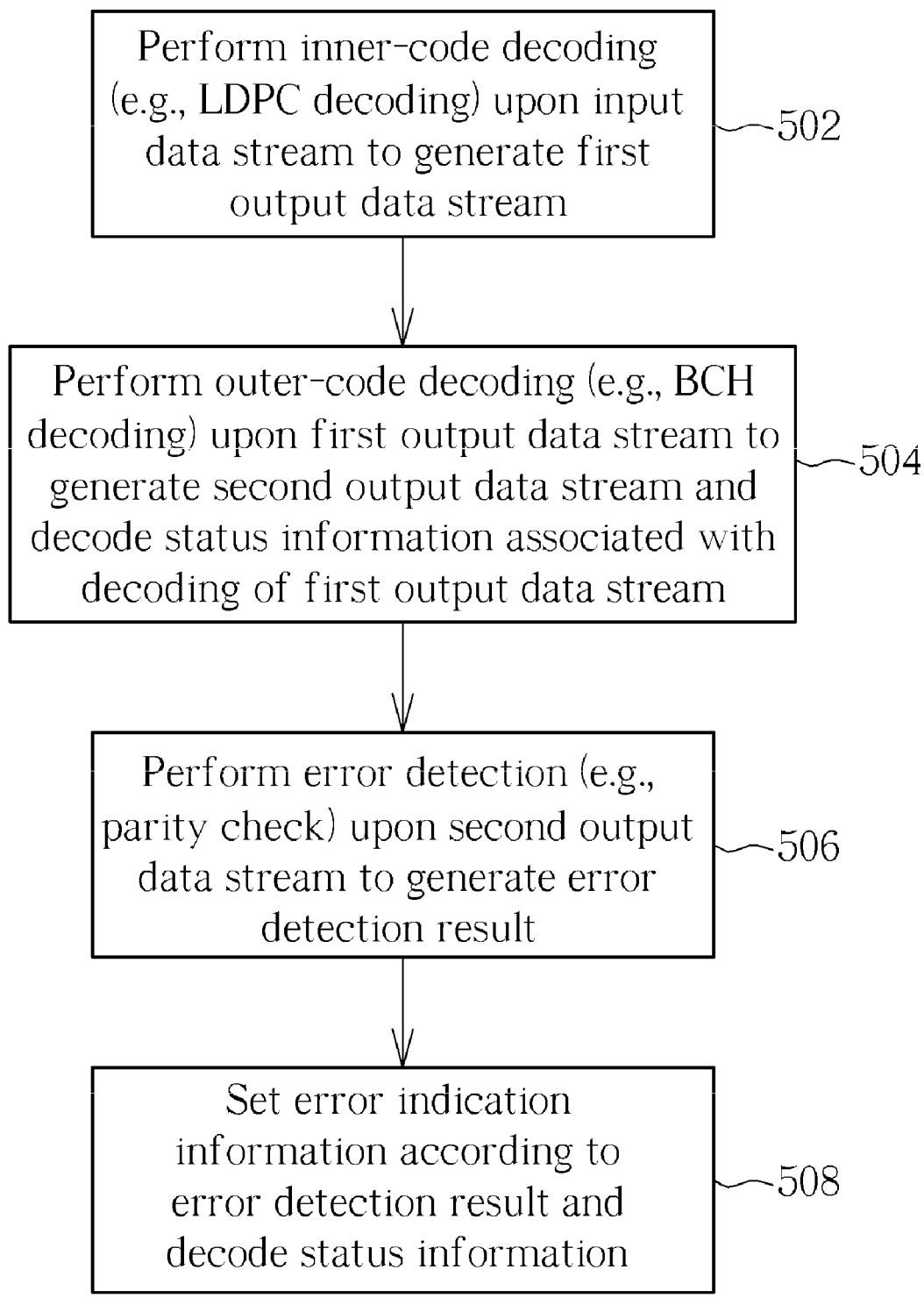
FIG. 5 is a flowchart illustrating another exemplary method of setting error indication information according to the present invention.

FIG. 5 is a flowchart illustrating another exemplary method of setting error indication information according to the present invention. The above disclosure directed to setting the error indication information through the second error identification approach can be briefly summarized using steps shown in FIG. 5. If the result is substantially the same, the steps are not required to be executed in the exact order shown in FIG. 5. The flow includes following steps:

Step 502: Perform an inner-code decoding (e.g., a LDPC decoding) upon an input data stream to generate a first output data stream.

Step 504: Perform an outer-code decoding (e.g., BCH decoding) upon first output data stream to generate a second output data stream and decode status information associated with decoding of the first output data stream.

Step 506: Perform an error detection (e.g., a parity check) upon the second output data stream to generate an error detection result.

Step 508: Set error indication information according to the error detection result and decode status information.

As a person skilled in the art would readily understand operation of each step shown in FIG. 5 after reading above paragraphs, further description is omitted here for brevity.

Those skilled in the art will readily observe that numerous modifications and alterations of the device and method may be made while retaining the teachings of the invention.

What is claimed is:

1. A signal processing apparatus, comprising:
an inner-code decoder, for decoding an input data stream to generate a first output data stream, wherein the input data stream is coded using a concatenated coding scheme including an outer coding and an inner coding;
an outer-code decoder, coupled to the inner-code decoder, for decoding the first output data stream to generate a second output data stream;
an error detection unit, coupled to the outer-code decoder, for performing an error detection upon the second output data stream to generate an error detection result; and
a decision logic, coupled to the error detection unit, for setting error indication information of the second output data stream according to at least the error detection result.

2. The signal processing apparatus of claim 1, wherein the decision logic sets error indication information of the second output data stream by modifying a transport stream error indication (TEI) bit of a packet of the second output data stream.

3. The signal processing apparatus of claim 1, wherein the inner-code decoder is an LDPC decoder, the outer-code decoder is a BCH decoder, and the error detection unit is a parity check unit.

4. The signal processing apparatus of claim 3, wherein the parity check unit and the LDPC decoder share one parity check logic in a time-sharing manner.

5. The signal processing apparatus of claim 4, wherein the parity check unit is part of the LDPC decoder.

6. The signal processing apparatus of claim 3, wherein the decision logic compares a number of failed parity checks derived from the error detection result with a threshold value to generate a comparison result, and sets the error indication information according to the comparison result.

7. The signal processing apparatus of claim 6, wherein the threshold value is set according to a code rate of the inner coding.

8. The signal processing apparatus of claim 6, further comprising:
a backend processor, coupled to the BCH decoder, for processing information derived according to the second output data stream, and configuring the threshold value set to the decision logic.

9. The signal processing apparatus of claim 1, wherein the input data stream complies with a digital terrestrial multimedia broadcast (DTMB) standard.

10. The signal processing apparatus of claim 1, wherein the outer-code decoder further generates decode status information associated with decoding of the first output data stream to the decision logic, and the decision logic sets the error indication information according to the error detection result and the decode status information.

11. The signal processing apparatus of claim 10, wherein when the decode status information indicates that a codeword contains uncorrectable error bits, the error detection unit does not perform the error detection upon data including the codeword generated from the inner-code decoder, and the decision logic sets the error indication information according to the decode status information.

12. A signal processing method, comprising:
performing an inner-code decoding upon an input data stream to generate a first output data stream, wherein the input data stream is coded using a concatenated coding scheme including an outer coding and an inner coding;
performing an outer-code decoding upon the first output data stream to generate a second output data stream;
performing an error detection upon the second output data stream to generate an error detection result; and
setting error indication information of the second output data stream according to at least the error detection result.

13. The signal processing method of claim 12, wherein the inner-code decoding is an LDPC decoding, the outer-code decoding is a BCH decoding, and the error detection is a parity check.

14. The signal processing method of claim 13, wherein the step of setting the error indication information comprises:
comparing a number of failed parity checks derived from the error detection result with a threshold value to generate a comparison result; and
setting the error indication information according to the comparison result.

15. The signal processing method of claim 14, wherein the step of setting the error indication information further comprises:
setting the threshold value according to a code rate of the inner coding.

16. The signal processing method of claim 13, wherein the step of setting the error indication information comprises:
modifying a transport stream error indication (TEI) bit of a packet of the second output data stream.

17. The signal processing method of claim 12, wherein the input data stream complies with a digital terrestrial multimedia broadcast (DTMB) standard.

18. The signal processing method of claim 12, wherein the step of performing the outer-code decoding further comprises:
generating decode status information associated with decoding of the first output data stream; and
the step of setting the error indication information comprises:
setting the error indication information according to the error detection result and the decode status information.

19. The signal processing method of claim 18, wherein the step of performing the error detection further comprises:
when the decode status information indicates that a codeword contains uncorrectable error bits, stopping performing the error detection upon data including the codeword generated from the inner-code decoding; and
the step of setting the error indication information comprises:
setting the error indication information according to the decode status information.

* * * * *